United States Patent [19]

Oinuma et al.

[11] Patent Number: 5,706,951
[45] Date of Patent: Jan. 13, 1998

[54] PACKING STRUCTURE FOR CONTAINER FOR SEMICONDUCTOR WAFER AND PACKING METHOD FOR CONTAINER

[75] Inventors: Kenji Oinuma; Katsuaki Yamaguchi, both of Annaka, Japan

[73] Assignee: Shin-Etsu Handotai Co., Ltd., Tokyo, Japan

[21] Appl. No.: 761,792

[22] Filed: Dec. 6, 1996

Related U.S. Application Data

[63] Continuation of Ser. No. 376,410, Jan. 23, 1995, abandoned.

[30] Foreign Application Priority Data

May 11, 1994 [JP] Japan .................................. 6-097488

[51] Int. Cl.[6] ............................. B65D 85/38; B65D 85/90
[52] U.S. Cl. ......................... 206/710; 206/592; 206/594; 206/721
[58] Field of Search .......................... 206/701, 710–712, 206/719–721, 591, 592, 594

[56] References Cited

U.S. PATENT DOCUMENTS

| | | | |
|---|---|---|---|
| 4,494,651 | 1/1985 | Malcolm | 206/45.34 |
| 4,699,830 | 10/1987 | White | 206/720 |
| 4,767,003 | 8/1988 | Rice et al. | 206/45.34 |
| 4,792,042 | 12/1988 | Koehn et al. | 206/721 |
| 4,817,795 | 4/1989 | Kos | 206/711 |
| 5,248,033 | 9/1993 | Kos et al. | |
| 5,253,755 | 10/1993 | Maenke | 206/711 |
| 5,255,783 | 10/1993 | Goodman et al. | |
| 5,366,080 | 11/1994 | Carstersen et al. | 206/719 |
| 5,385,232 | 1/1995 | Foos et al. | 206/594 |

*Primary Examiner*—Jimmy G. Foster
*Attorney, Agent, or Firm*—Oliff & Berridge, P.L.C.

[57] ABSTRACT

A packing structure for a container for containing semiconductor wafers is disclosed. The packing structure comprises a polypropylene box, and upper and lower pressing members for sandwiching the container for containing semiconductor wafers, wherein both the upper and lower pressing members comprise an olefinic resin.

16 Claims, 7 Drawing Sheets

PACKING STRUCTURE FOR CONTAINER FOR SEMICONDUCTOR WAFER AND PACKING METHOD FOR CONTAINER

This is a Continuation of application Ser. No. 08/376,410 filed Jan. 23, 1995 now abandoned.

BACKGROUND OF THE INVENTION

1. Field of the Invention

The present invention relates to a packing structure suitable for transportation of plastic containers for containing semiconductor wafers or the like, in particular, to a packing structure for a container for containing semiconductor wafers, which can decrease particles produced during transportation, and to a packing method for the container.

2. Description of Related Art

Conventionally, a packing structure for preventing scratch or destruction of semiconductor wafers contained in a container during transportation is known. For example, in such a packing structure, a plastic container for containing a plurality of semiconductor wafers is further contained in a corrugated fibreboard box made of paper, and the upper and lower sides of the container are covered by an upper and a lower pressing members which are made of styrene foam or polyurethane foam, in order to restrain the movement of the container in the corrugated fibreboard box. Such a packing structure intends to prevent scratch or destruction of the container which may be occurred by vibration during transportation or by shock from the outside, and to prevent scratch or the like of the wafers contained in the container.

Each of the upper and lower pressing members used for the packing structure comprises a relatively thick member comprising styrene foam or polyurethane foam, as described above. These upper and lower pressing members are arranged to sandwich the container for semiconductor wafers therebetween, and to cover the upper and lower sides of the container in order to prevent the movement of the container in the corrugated fibreboard box.

Since the conventional packing structure uses a corrugated fibreboard box made of paper, scratch or destruction of the box often occurs by vibration or shocks during transportation or conveyance. Further, because of strong shock to the container contained in the box, it is often found that scratch or destruction of the container itself occurs when the packing structure is unpacked. Consequently, there has been a problem that scratch or destruction of the wafers contained in the container also often occurs.

In the corrugated fibreboard box made of paper, dusts or particles are generated in the box by rubbing of the inner surface of the box with the pressing members, which is caused by vibration or shock during transportation or conveyance, and the dusts or particles adhere to the container for semiconductor wafers. As a result, there is a problem that the particles adhere to the surfaces of the wafers when taking the wafers out of the container.

Production costs of one paper corrugated fibreboard box are relatively low in comparison with that of one plastic corrugated fibreboard box. However, since the paper corrugated fibreboard box is easily damaged by vibration or shocks during transportation, the life thereof is short and it is difficult to reuse it. Therefore, the corrugated fibreboard box made of paper has the disadvantage of high production costs in the long term.

A packing structure comprising a corrugated fibreboard box made of a plastic which is relatively strong and generates less particles in comparison with one made of paper, and an upper and a lower pressing members provided in the box, which are made of styrene foam or polyurethane foam, is known.

Because such a packing structure uses pressing members made of styrene foam or polyurethane foam, particles are generated in the structure by the rubbing of the surface of the styrene foam or polyurethane foam caused by vibration or a shock during transportation. The generated particles adhere to the inner surface of the corrugated fibreboard box or to the outer surface of the container for containing semiconductor wafers. As a result, there is a problem that the particles adhere to the surfaces of the wafers when opening or closing of the container or when taking the wafers out of the container. In particular, when pressing members made of styrene foam are used, a large amount of dusts in the box are adhered to the pressing members because the members made of styrene foam easily generates static electricity. This contributes to the adhesion of particles to the surface of the wafers.

Although the above-mentioned pressing members made of styrene foam or polyurethane foam can resist vibration or a shock caused by transportation to some extent, they cannot resist strong vibration or a strong shock caused by a rough treatment or the like and do not perform the buffer function thereof. In particular, when wafers with a large diameter (e.g., a size of 8 inches) are contained in a container, the container is often damaged because of their large weight.

Recently, there are various kinds of regulations caused by requirements of global environment to wastes of members comprising styrene foam or polyurethane foam which is used as pressing members. The problem of such wastes is important on environmental sanitation. Since the corrugated fibreboard box comprising paper is very weak and easily damaged, it has disadvantages in that the damaged box cannot be used again although can reused by reprocessing.

In order to transport number of wafers, a number of corrugated fibreboard boxes and a number of pressing members is required. There is a problem that a very large space and large costs for storage are required because it is necessary to stack the pressing members comprising styrene foam having a large thickness when the pressing members are stored.

SUMMARY OF THE INVENTION

The present invention was developed in view of the above-described problem.

An object of the present invention is to provide a packing structure and a packing method for a container for containing semiconductor wafers, which can prevent scratch or destruction of the container or of wafers, which may be occurred by vibration or a shock during transportation of the wafers, and which can reduce generation of particles and adhesion of the particles to the surfaces of the wafers, caused by rubbing or static electricity of the surface of the pressing members.

Another object of the present invention is to provide a packing structure and a packing method for a container for containing semiconductor wafers, which can be not only used again as it is but reused by reprocessing and therefore can meet requirements of global environment which become important recently.

Further object of the present invention is to provide a packing structure and a packing method for a container for containing semiconductor wafers, which can reduce costs for transportation and the space for storage and enable an easy handling.

As a result of various kinds of investigations to solve the above problems, the inventors found that it is possible to provide an excellent packing structure and a packing method for a container for containing semiconductor wafers, which is not adversely affected by vibration or a shock from the outside and can reduce generation of particles caused by rubbing or static electricity of the surface of the pressing members, by using a polypropylene box in place of a conventional corrugated fibreboard box comprising paper, and by using upper and lower pressing members comprising an olefinic resin which has a high shock resistance and can meet requirements of global environment, in place of conventional pressing members made of styrene foam or polyurethane foam. Consequently, the present invention has been completed.

That is, in accordance with one aspect of the present invention, the packing structure for a container for containing semiconductor wafers comprises; a polypropylene box, and upper and lower pressing members for sandwiching a container for containing semiconductor wafers, wherein both the upper and lower pressing members comprise an olefinic resin, preferably polypropylene.

In accordance with another aspect of the present invention, the method for packing a container for containing semiconductor wafers comprises the steps of; setting a lower pressing member comprising an olefinic resin in a polypropylene box, setting a container for containing semiconductor wafers on a predetermined position of the lower pressing member, and setting an upper pressing member comprising an olefinic resin on the set container.

Preferably, the lower pressing member comprises four side walls which rise from near the periphery of the lower end thereof, and an upper surface having at least one depressed portion which can tightly set the lower portion of the container for containing semiconductor wafers therein, the periphery of the lower end of the lower pressing member being formed to tightly fit to the four inner side walls of the box; and the upper pressing member comprises a lower surface having at least one depressed portion which can tightly set the upper portion of the container, the periphery of the upper end of the upper pressing member being formed to tightly fit to the four inner side walls of the box.

According to a packing structure comprising the upper and lower pressing members having such specific shapes, it is possible to obtain more excellent cushioning and handling properties. Since the lower ends of four side walls of the lower pressing member and the upper ends of four side walls of the upper pressing member tightly fit to the four inner side walls of the polypropylene box, it is possible to prevent movements of the container in horizontal directions in the box, and therefore the container can be stably supported.

Each side wall of the lower pressing member may be formed to have a small tilt, e.g., of 5°–10°, toward the inside. Accordingly, this member can be reinforced when the container is tightly set in the depressed portions of the lower pressing member, so that the container can be stably supported.

At least one depressed portion of the lower and upper pressing members may have an opening. Accordingly, air resistance which acts upon the lower pressing member when the member is set in the box, can be reduced by providing the opening. Consequently, it is possible not only to smoothly set the lower pressing member in the box but to easily take the lower pressing member out of the box by hooking the lower pressing member by a finger or a hand through the opening.

The packing structure of the present invention, preferably, further comprises a laminated aluminum film for covering the entirety of the container. The laminated aluminum film covers the container, prior o setting the container on the predetermined position of the lower pressing member. According to providing the laminated aluminum film for covering the container, it is possible not only to make the cushioning property of the packing structure well but also to prevent a gas including moisture which passes through a plastic film from entering the container.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

PREFERRED EMBODIMENT OF THE INVENTION

Hereinafter, a packing structure and a packing method for a container for containing semiconductor wafers according to the present invention will be explained with reference to the drawings.

Figure 1:
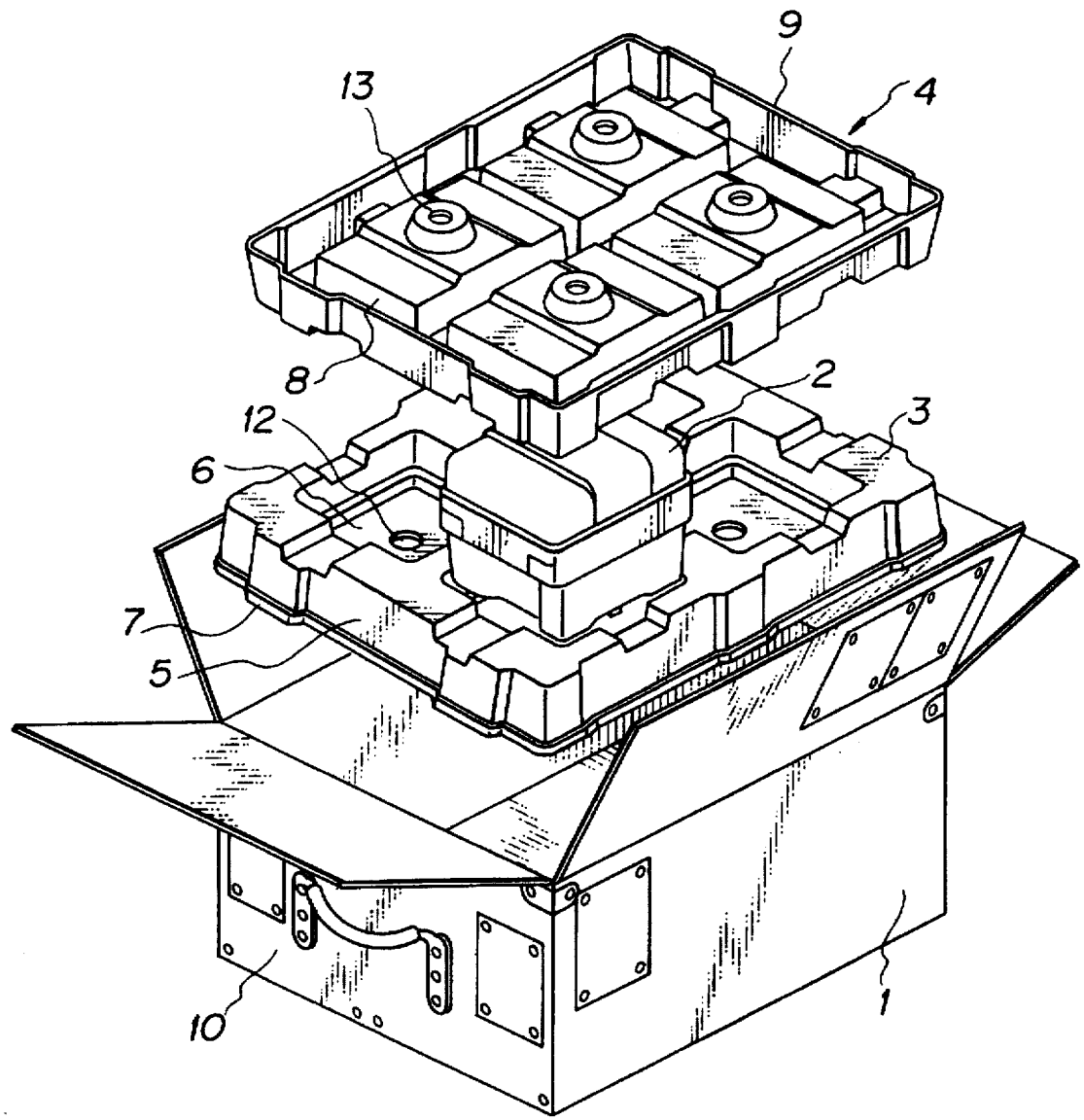
FIG. 1 is a perspective view showing an embodiment of the packing structure for a container for containing semiconductor wafers according to the present invention.

As shown in FIG. 1, the packing structure according to an embodiment of the present invention mainly comprises a polypropylene box 1, and a lower pressing member 3 and an upper pressing member 4 which put a container 2 for storing semiconductor wafers therebetween.

The polypropylene box 1 used for the packing structure according to the embodiment has excellent durability in comparison with a conventional corrugated fibreboard box made of paper, and can be used again as it is and reused by reprocessing in view of global environment.

The box 1 has an external shape of a rectangular parallelepiped or a cube. The upper portion of the box can be opened and closed, similarly to the conventional corrugated fibreboard box made of paper. The container 2 for containing semiconductor wafers and the like can be contained into the box through the upper portion thereof.

The polypropylene box 1 has a size depending on the number of the container 2 for semiconductor wafers to be contained in the box. For example, the box has a size which enables containing 4 to 8 containers for wafers in the box 1 when the container is for 6-inch size wafers, and a size which enables containing 2 to 4 containers for wafers in the box when the container is for 8-inch size wafers.

In the polypropylene box 1, the lower pressing member 3 and the upper pressing member 4 which put the container 2 for semiconductor wafers therebetween, are set.

After only the lower pressing member 3 was set in the polypropylene box 1, the container 2 may be also put on the predetermined position of the set lower pressing member 3, and thereafter, the upper pressing member 4 may be set on the put container.

Each of the pressing members 3 and 4 is preferably produced by using a sheet with a thickness of about 1.0 mm to 1.1 mm which is formed by a known vacuum forming.

The lower pressing member 3 and the upper pressing member 4 comprise an olefinic resin, e.g., polypropylene, polyethylene, polybutadiene, or the like. It is preferable to use polypropylene for the pressing members because the deformation thereof during forming is small. The above members have a good cushioning property and are strong against vibration or a shock from the outside, in comparison with the members made of styrene foam or polyurethane foam. The above members can reduce particles which are generated by rubbing of the surface of the pressing members caused by vibration or a shock, and hardly generate static electricity. Therefore, particles are hard to adhere to the inner surface of the box 1 or to the outer surface of the container 2. Furthermore, these members are very good material in view of global environment, that is, these members can be used again as it is and reused by reprocessing, as well as the above-described box 1.

The above-described lower pressing member 3, the container 2 for semiconductor wafers, and the upper pressing member 4 are contained in the polypropylene box 1. In the present invention, in the box 1, the lower pressing member 3, the container 2 for semiconductor wafers, and the upper pressing member 4 are set in this order. Thereafter, the packing structure is packed up by closing the upper portion of the box 1 by using an adhesive tape, a Hook-and-Loop-fastener or the like.

In packing up the structure, the container 2 containing semiconductor wafers can be sandwiched between the lower pressing member 3 and the upper pressing member 4, as it is, and also the container 2 packed with a laminated aluminum film can be sandwiched between the lower and upper pressing member 3 and 4, if necessary. The laminated aluminum film comprises an aluminum sheet having plastic layers on both surfaces thereof. According to use of such a laminated aluminum film, it is possible not only to make the cushioning property of the packing structure well but also to prevent a gas including moisture which passes through a plastic film from entering the container. In the present invention, it is possible to provide a packing structure having more excellent cushioning and handling properties, by making the lower pressing member 3 and the upper pressing member 4 have specific shapes.

The lower pressing member 3 used in the packing structure of the present invention has four side walls 5 which rise from near the periphery of the lower end thereof, and an upper surface having depressed portions 6 in each of which the lower portion of the container 2 for containing semiconductor wafers can be tightly set.

The number of the depressed portions 6 is properly selected by the number of the container 2 for containing semiconductor wafers to be contained in a box 1. For example, when the number of the container 2 to be contained in a box is 4, the depressed portions are formed at 4 positions of the upper surface of the lower pressing member 3; and when the number of the container 2 to be contained is 2, the depressed portions are formed at 2 positions of the upper surface.

Each depressed portions 6 has a shape in which the lower portion of the container 2 is tightly set and which preferably fits to the size of the container 2. However, the entirety of the four side walls of the container 2 is not required to be tightly set to the entirety of the inner side walls of the depressed portion 6. The bottom of the depressed portion 6 may be have a wave-form surface as needed.

Peripheral lips 7 which are formed at the lower ends of four side walls 5 of the lower pressing member 3 tightly fit to the four inner side walls of the box 1. Accordingly, it is possible to prevent movements of the container 2 which is set tightly to the depressed portion 6, in horizontal directions in the box 1, and to restrain adverse effect caused by vibration or shocks during transportation.

The upper pressing member 4 used in the packing structure of the present invention has a lower surface having depressed portions 8. In each of the depressed portions 8 of the upper pressing member 4, the upper portion of the container 2 which is tightly set in the depressed portions 6 of the lower pressing member 3 is tightly set. The number of the depressed portions 8 is properly selected by the number of the container 2 for containing semiconductor wafers to be contained in the box 1, similarly to the depressed portions 6 of the lower pressing member 3. For example, when the number of the container 2 to be contained in the box is 4, the depressed portions 8 are formed at 4 positions of the lower surface of the upper pressing member 4; and when the number of the container 2 to be contained is 2, the depressed portions 8 are formed at 2 positions of the lower surface of the upper pressing member 4.

Each depressed portions 8 has a shape in which the upper portion of the container 2 is tightly set and which preferably fits to the size of the container 2. However, the entirety of the four side walls of the container 2 is not required to be set tightly to the entirety of the inner side walls of the depressed portion 8. The bottom of the depressed portion 8 may have a wave-form surface as needed.

Peripheral lips 9 which are formed at the upper ends of four side walls of the upper pressing member 4 tightly fit to the four inner side walls of the box 1. Accordingly, it is possible to prevent movements of the container 2 which is set tightly to the depressed portion 8, in horizontal directions in the box 1, and to restrain adverse effect caused by vibration or shocks during transportation.

In the packing structure of the present invention, the side walls 5 of the lower pressing member 3, which rise from near the periphery of the lower end thereof, may be inclined at a small angle inward. Thereby, this member can be reinforced when the container is tightly set in the depressed portions 6 of the lower pressing member 3, so that the container can be stably supported.

It is desirable in view of strength that the side walls of the lower pressing member is usually inclined at a rising angle of 5°–10° with respect to the side walls 10 of the box 1.

In the bottom of each depressed portion 6 formed on the lower pressing member 3 which constitutes a part of the packing structure of the present invention, an opening 12 can be also provided as required. Accordingly, when the member 3 is set in the box 1, air resistance which acts upon the lower pressing member 3 can be reduced by providing the opening 12. Therefore, it is possible to smoothly set the lower pressing member in the box.

Although the opening 12 is generally formed at the center position in the depressed portion 6, it may be also formed at any position in the depressed portion 6. Generally, the opening 12 has a shape of a circle. The shape of the opening 12 can be selected from an ellipse, a quadrilateral, a triangle, polygon and the like, as needed.

In the bottom of each depressed portion 8 formed on the upper pressing member 4 which constitutes a part of the packing structure of the present invention, an opening 13 also can be provided as required. Accordingly, when the member 4 is set in the box 1, air resistance which acts upon the upper pressing member 4 can be reduced by providing the opening 13. Therefore, it is possible to smoothly set the upper pressing member 4 in the box 1. Furthermore, it is possible to easily take the member 4 out of the box by hooking the member 4 by a finger or a hand through the opening 13.

Although the opening 13 is usually formed at the center position in the depressed portion 8, it may be also formed at any position in the depressed portion 8. The opening 13 has a shape of a circle ordinarily. The shape of the opening 13 can be selected from an ellipse, a quadrilateral, a triangle, polygon and the like, as needed.

The container 2 for containing semiconductor wafers, which is not shown in the drawings, comprises a body part and a lid part which are made of a well-known plastic, usually polypropylene. For example, the container 2 contains 1–25 semiconductor wafers which are held on a supporting portion provided in the body part.

Next, another embodiment of the present invention will be explained with reference to FIGS. 2 and 3.

Figure 2A:
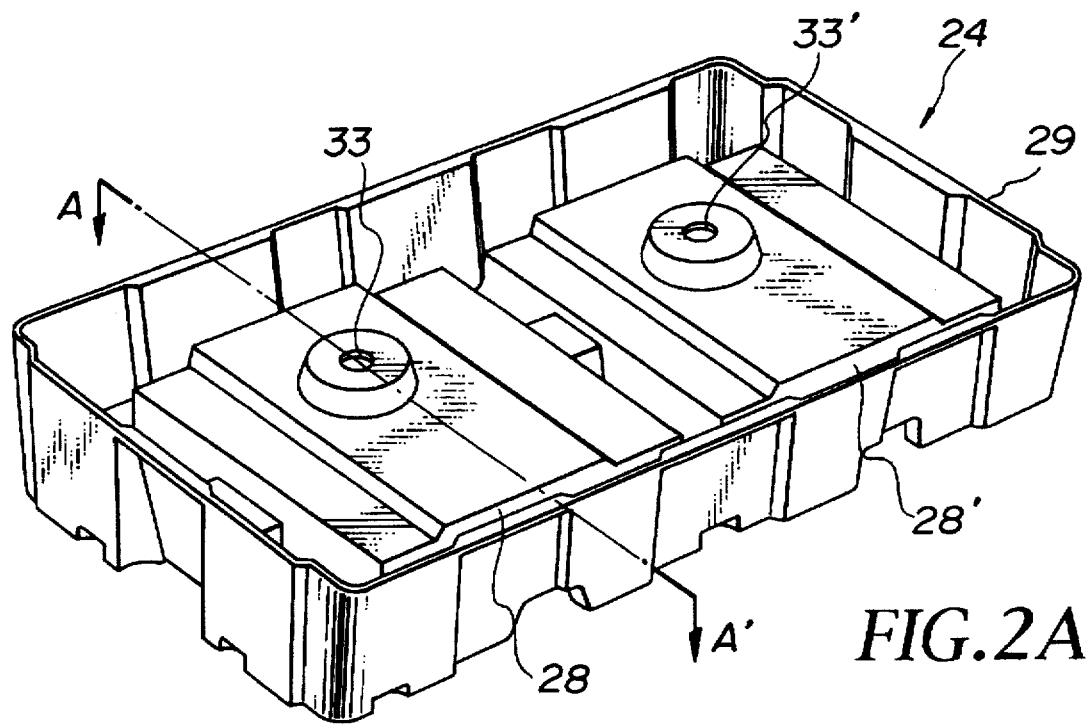
FIG. 2(A) and FIG. 2(B) are perspective views of an upper pressing member and a lower pressing member in another embodiment of the packing structure for containers for containing semiconductor wafers according to the present invention, respectively.
Figure 2B:
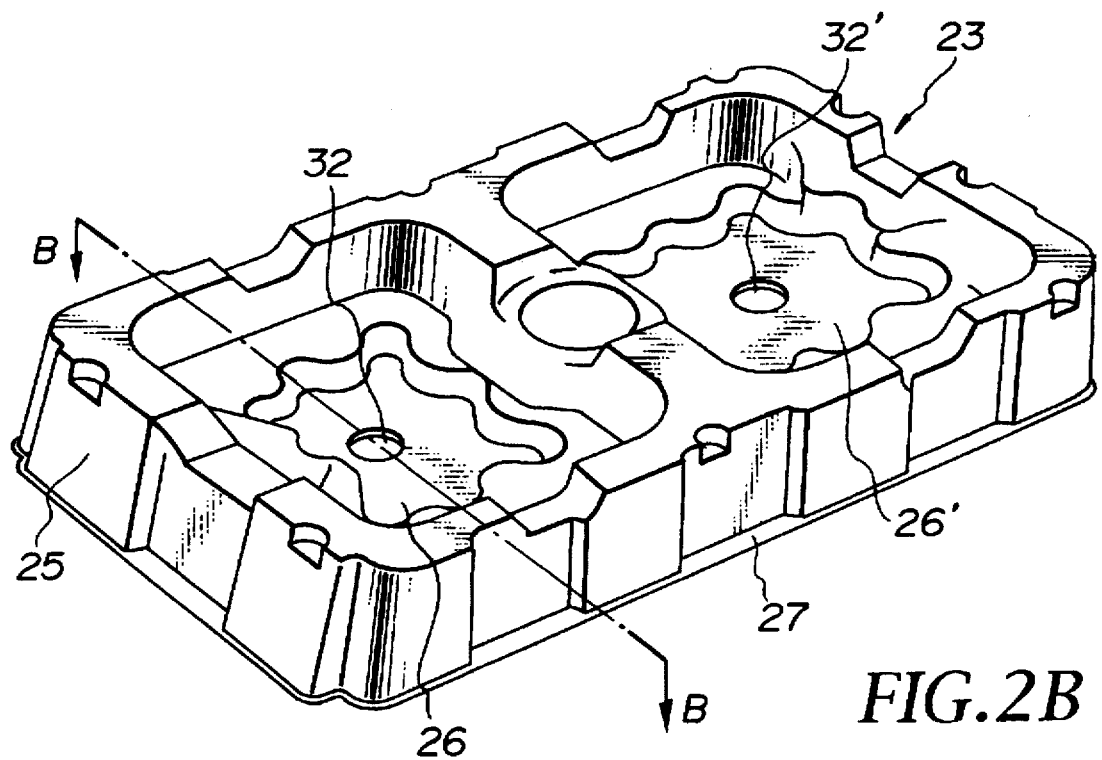

FIG. 2 relates to a packing structure which can set 2 containers for containing 8-inch size semiconductor wafers; wherein FIG. 2(A) is a perspective view of an upper pressing member comprising polypropylene, and FIG. 2(B) is a perspective view of a lower pressing member comprising polypropylene. FIG. 3 is a sectional view for explaining the pressing members of FIG. 2; wherein FIG. 3(A) is a cross-sectional view taken on line A–A' of FIG. 2(A), and FIG. 3(B) is a cross-sectional view taken on line B–B' of FIG. 2(B).

Figure 3A:
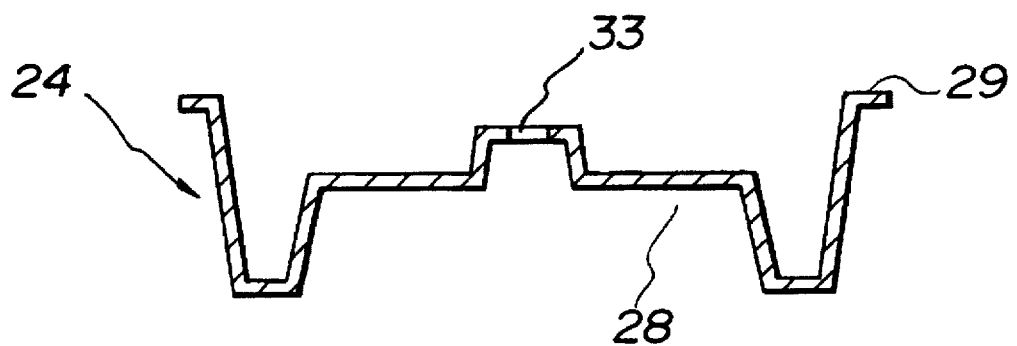
FIG. 3(A) is a cross-sectional view taken on line A–A' of FIG. 2(A)
Figure 3B:
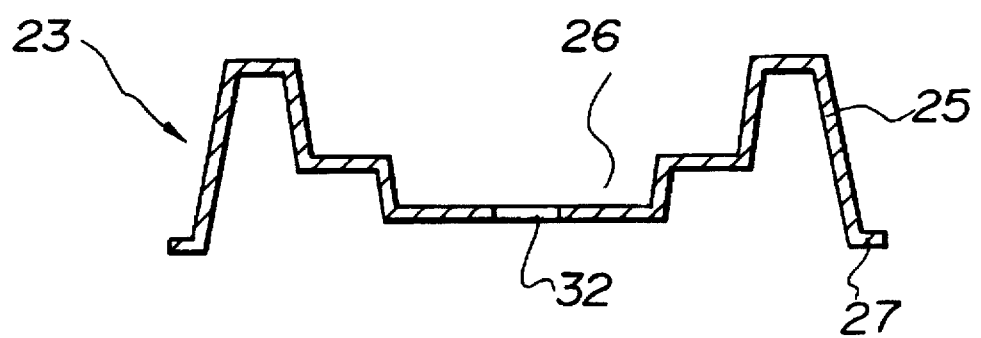
FIG. 3(B) is a cross-sectional view taken on line B–B' of FIG. 2(B)

The upper pressing member 24 has a lower surface with depressed portions 28 and 28' in each of which the upper portion of the container 2 is tightly set, as shown in FIGS. 2(A) and 3(A). Peripheral lips 29 which are provided at the upper ends of four side walls of the upper pressing member 24 are formed so that the lips tightly fit to the four inner side walls of the polypropylene box 1 when the member 24 is contained in the box. In the upper pressing member 24, openings 33 and 33' may be provided as required.

The lower pressing member 23 has four side walls 25 which rise from near the periphery of the lower end thereof, and an upper surface having depressed portions 26 and 26' in each of which the lower portion of the container 2 for containing semiconductor wafers can be tightly set. The depressed portions 26 and 26' may have a shape different from that of FIG. 1, and the bottom of each depressed portion has a wave-form surface as needed.

Peripheral lips 27 which are provided at the upper ends of the four side walls 25 are formed so that the lips tightly fit to the four inner side walls of the polypropylene box 1 when the member 23 is contained in the box.

Since the lower pressing member 23 used in the packing structure of the embodiment has a shape as shown in FIG. 3(b), it is possible to stack a plurality of the lower pressing members. Therefore, space required for storing these members is about 1/10 of that of conventional members made of styrene foam. It is possible to effectively utilize space. Since the upper pressing member 24 has a shape as shown in FIG. 3(a), it is possible also to stack a plurality of the upper pressing members. Therefore, it is possible to further effectively utilize space.

[EXAMPLE 1]

A polypropylene lower pressing member, a polypropylene container containing semiconductor wafers, and a polypropylene upper pressing member were set in a polypropylene box in this described order, to complete packing of the structure. Thereafter, a transportation test and a drop test for the package as follows were carried out and the change of the amount of particles on the wafers was examined.

(Transportation test)

1. Wafers of 8-inch size are cleaned by using chemicals of RCA system [Reference: N Kern and D. W. Poutimen, RCA review, 31, 187(1970)].

2. Two containers each of which contains 25 wafers therein are used.

3. These containers are packed by a laminated aluminum film.

4. The package is opened and the number $P_0$ of particles which have a diameter larger than 0.2 μm, on the wafers before transportation is measured by using a measuring apparatus (WIS-850) produced by ESTEK Co., Ltd.

5. After the measurement, wafers are contained into the containers again and the containers with wafers therein are packed by a laminated aluminum film. The alminum-packed containers are tightly set in predetermined depressed portions of the upper and lower pressing members as shown in FIG. 2. The containers and the upper and lower pressing members are packed into the box, and the upper surface of the box is fixed by using an adhesive tape. The packed box is made a round trip between Tokyo and Fukuoka by air transportation.

6. The transported package is opened and the number $P_1$ of particles which have a diameter larger than 0.2 μm, on the wafers after transportation is measured by using a measuring apparatus similar to that of the above paragraph 4.

7. The amount of the change $\Delta P$ ($\Delta P = P_1 - P_0$) in the number of particles, which is caused by transportation, is calculated from $P_0$ and $P_1$ which are obtained in the paragraphs 4 and 6.

(Drop test)

After preliminary treatments as described in the paragraphs 1–4 were carried out, similarly to the transportation test, a packing treatment similar to the paragraph 5 was carried out. The package was dropped from a position of 90 cm above the ground to a concrete floor according to "Method of Drop Test for Packaged Freights" (JIS Z 0202) of Japanese Industrial Standard and "General Rules of Performance Testing for Packaged Freights" (JIS Z 0200). Thus, the amount of the change $\Delta P'$ in the number of particles, which is caused by the drop, is calculated, similarly to the transportation test.

[COMPARATIVE EXAMPLE 1]

A transportation test and a drop test for a package were carried out, and the amounts of the change $\Delta P$ and $\Delta P'$ in the number of particles on the wafers by the transportation and drop tests, respectively, were calculated, similar to that of EXAMPLE 1. In these tests, a corrugated fibreboard box made of paper, and upper and lower pressing members made of polyurethane foam were used in place of a corrugated fibreboard box comprising polypropylene, and upper and lower pressing members comprising polypropylene, which were used in EXAMPLE 1, respectively.

Figure 4:
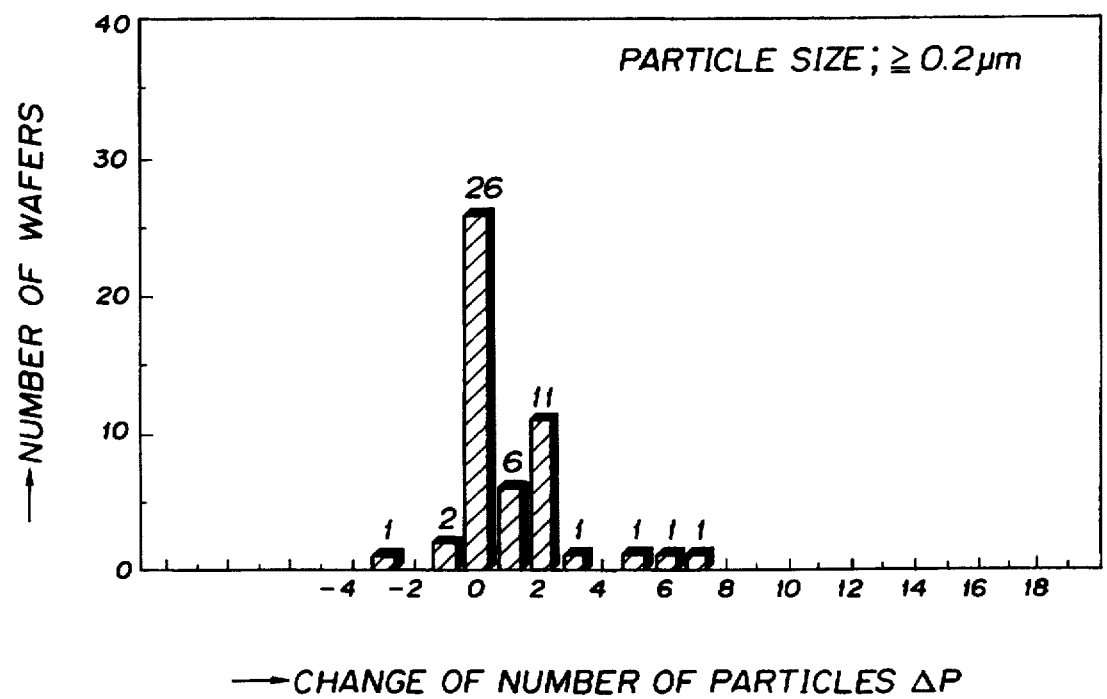
FIG. 4 is a graph showing the relationship between the change of the number of particles on the wafers and the number of corresponding wafers after the transportation test of the Embodiment 1 was carried out.
Figure 5:
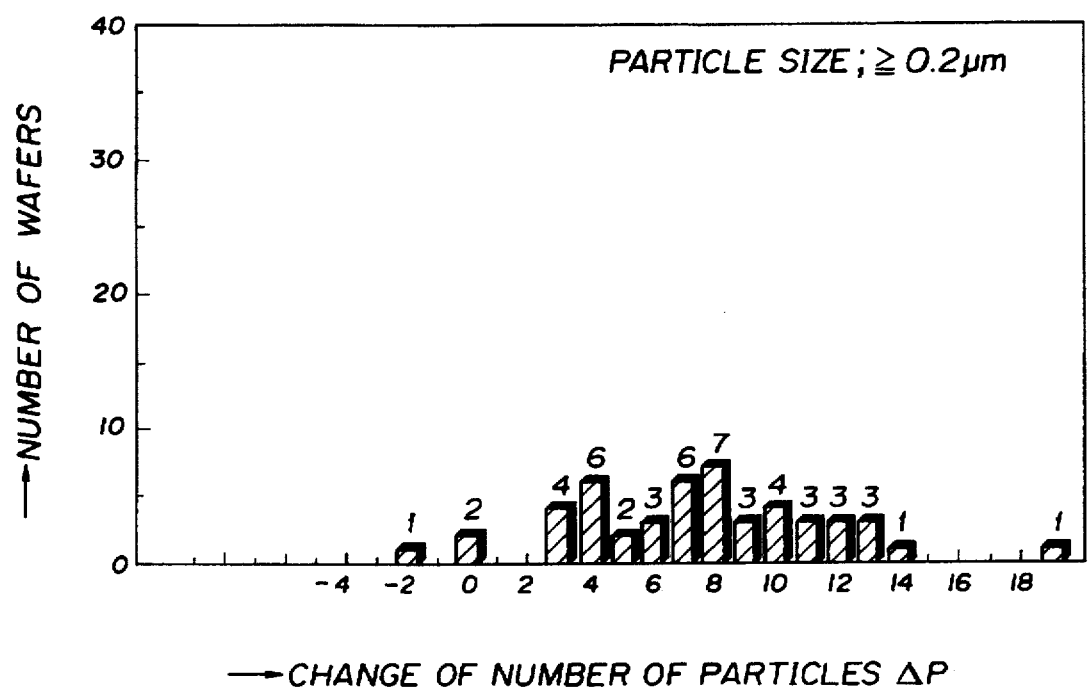
FIG. 5 is a graph showing the relationship between the change of the number of particles on the wafers and the number of corresponding wafers after the transportation test of the Comparative Example 1 was carried out.
Figure 6:
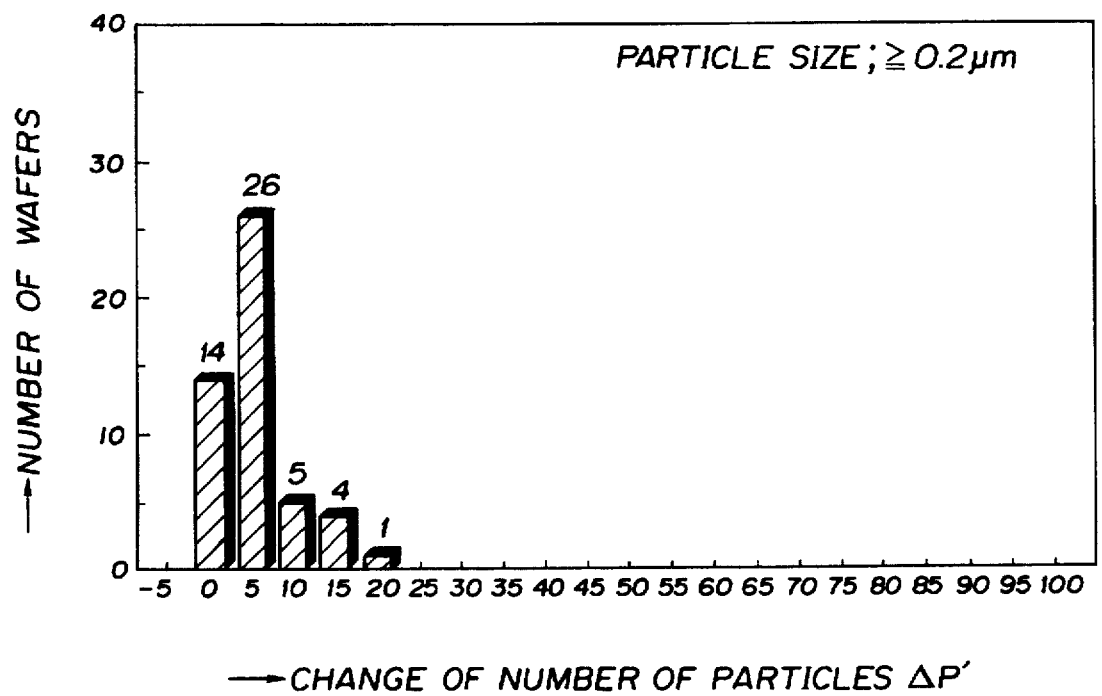
FIG. 6 is a graph showing the relationship between the change of the number of particles on the wafers and the number of corresponding wafers after the drop test of the Embodiment 1 was carried out.
Figure 7:
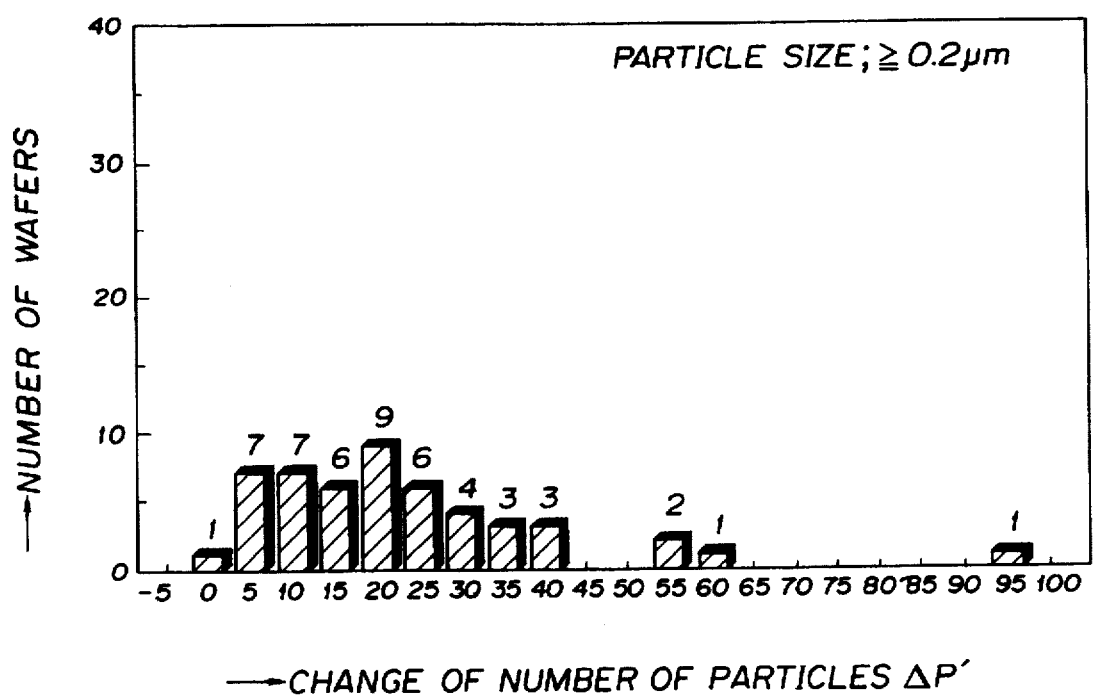
FIG. 7 is a graph showing the relationship between the change of the number of particles on the wafers and the number of corresponding wafers after the drop test of the Comparative Example 1 was carried out.

The relationship between the changes of the number of particles on the wafers, which are obtained in EXAMPLE 1 or COMPARATIVE EXAMPLE 1, and the number of corresponding wafers, is shown in FIGS. 4–7. FIG. 4 shows a result of the measurement according to the transportation test of the Embodiment of the present invention. FIG. 5 shows a result of the measurement according to the transportation test of the COMPARATIVE EXAMPLE. FIG. 6 shows a result of the measurement according to the drop test of EXAMPLE of the present invention. FIG. 7 shows a result of the measurement according to the drop test of the COMPARATIVE EXAMPLE.

As apparently shown in FIGS. 4–7, it is seen that according to the EXAMPLE, increase of particles on wafers is small and the distribution of variation of number of particles on wafers before and after the transportation test or the drop test is also extremely small. On the contrary, according to the COMPARATIVE EXAMPLE, it is seen that the distribution of variation of number of particles on wafers before and after the transportation test or the drop test is large, that is, unstable results are obtained.

According to the packing structure and the packing method for a container for containing semiconductor wafers, of the present invention, since upper and lower pressing members comprising an olefinic resin are used in place of conventional pressing members made of styrene foam or polyurethane foam, it is possible to reduce generation of particles caused by rubbing of the surface of the pressing members by vibration or shock during transportation. Furthermore, since the packing structure of the present invention has a good cushioning property and are strong against a shock from the outside, it is possible to prevent damage or destruction of the container which contains even wafers with a diameter larger than 8 inches, and therefore to stably hold the wafers in the container.

Because the box, upper pressing member and the lower pressing member are comprising an olefinic resin such as polypropylene, the packing structure of the present invention is excellent in view of global environment, that is, the packing structure can be used again as it is and reused by reprocessing. Since a polypropylene box is used in the present invention, instead of a paper corrugated fibreboard box, although production costs of one packing structure is relatively high, the durability thereof is excellent, that is, the life thereof is long and it is possible to reduce the transportation costs in the long term.

What is claimed is:

1. A packing structure for a container for containing particle sensitive articles comprising:

a polypropylene box, and upper and lower pressing members positioned within the box, each of which has at least one depressed portion which can tightly set a portion of a container for containing particle sensitive articles, therein, wherein the upper and lower pressing members comprise molded olefinic resin sheets.

2. A packing structure as claimed in claim 1; wherein the lower pressing member comprises four side walls which rise from near the periphery of the lower end thereof, and an upper surface having the at least one depressed portion having at least a pair of side walls which can tightly set at least a pair of side walls of the lower portion of the container, the periphery of the lower end of the lower pressing member being formed to tightly fit to four inner side walls of the box; and the upper pressing member comprises a lower surface having the at least one depressed portion having at least a pair of side walls which can tightly set at least a pair of side walls of the upper portion of the container, the periphery of the upper end of the upper pressing member being formed to tightly fit to the four inner side walls of the box.

3. A packing structure as claimed in claim 2, wherein each side wall of the lower pressing member is formed to have a small tilt toward the inside.

4. A packing structure as claimed in claim 3, wherein each side wall of the lower pressing member is inclined at a rising angle of 5°–10° with respect to each side wall of the box toward the inside.

5. A packing structure as claimed in claim 2, wherein at least one depressed portion of the lower and upper pressing members has an opening.

6. A packing structure as claimed in claim 3, wherein at least one depressed portion of the lower and upper pressing members has an opening.

7. A packing structure as claimed in claim 1, wherein the lower and upper pressing members comprise polypropylene.

8. A packing structure as claimed in claim 1, wherein the lower and upper pressing members comprise a vacuum-formed olefinic resin sheet.

9. A packing structure as claimed in claim 1, further comprising a laminated aluminum film for covering the entirety of the container.

10. A packing structure as claimed in claim 1, wherein the packing structure further comprises a container having particle sensitive articles therein sandwiched between the pressing members.

11. A packing structure for a container for containing particle sensitive articles comprising:

a polypropylene box, and upper and lower pressing members positioned within the box for sandwiching a container for containing particle sensitive articles, wherein the upper and lower pressing members comprise molded olefinic resin sheets; the lower pressing member comprising four side walls having a small tilt toward the inside which rise from near the periphery of the lower end thereof, and an upper surface having at least one depressed portion having at least a pair of side walls which can tightly set at least a pair of side walls of the lower portion of the container, the periphery of the lower end of the lower pressing member being formed to tightly fit to four inner side walls of the box; and the upper pressing member comprising a lower surface having at least one depressed portion having at least a pair of side walls which can tightly set at least a pair of side walls of the upper portion of the container, the periphery of the upper end of the upper pressing member being formed to tightly fit to the four inner side walls of the box.

12. A packing structure as claimed in claim 11, wherein each side wall of the lower pressing member is inclined at a rising angle of 5°–10° with respect to each side wall of the box toward the inside.

13. A packing structure as claimed in claim 11, wherein at least one depressed portion of the lower and upper pressing members has an opening.

14. A packing structure as claimed in claim 11, wherein the lower and upper pressing members comprise polypropylene.

15. A packing structure as claimed in claim 11, wherein the lower and upper pressing members comprise a vacuum-formed olefinic resin sheet.

16. A packing structure as claimed in claim 11, further comprising a laminated aluminum film for covering the entirety of the container.

* * * * *